(12) United States Patent
Chou

(10) Patent No.: US 7,627,946 B2
(45) Date of Patent: Dec. 8, 2009

(54) METHOD FOR FABRICATING A METAL PROTECTION LAYER ON ELECTRICALLY CONNECTING PAD OF CIRCUIT BOARD

(75) Inventor: Pao-Hung Chou, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 291 days.

(21) Appl. No.: 11/688,181

(22) Filed: Mar. 19, 2007

(65) Prior Publication Data
US 2007/0218591 A1 Sep. 20, 2007

(30) Foreign Application Priority Data
Mar. 20, 2006 (TW) .............................. 95109420 A

(51) Int. Cl.
*H01L 21/00* (2006.01)
(52) U.S. Cl. .............................. 29/846; 29/831; 29/842; 29/852; 205/118; 205/125; 174/260; 174/262; 361/792
(58) Field of Classification Search .................... 29/842, 29/831, 846, 852; 205/118, 125; 174/262–266, 174/260; 361/792–795
See application file for complete search history.

(56) References Cited

U.S. PATENT DOCUMENTS

| | | | | |
|---|---|---|---|---|
| 6,291,779 | B1 * | 9/2001 | Lubert et al. | 174/265 |
| 6,576,540 | B2 * | 6/2003 | Chen et al. | 438/612 |
| 7,045,460 | B1 * | 5/2006 | Weng et al. | 438/671 |
| 2003/0070931 | A1 * | 4/2003 | Kitchens | 205/118 |
| 2003/0188886 | A1 * | 10/2003 | Fey et al. | 174/256 |

FOREIGN PATENT DOCUMENTS

TW 515061 B 12/2002

* cited by examiner

*Primary Examiner*—Derris H Banks
*Assistant Examiner*—Jeffrey Carley
(74) *Attorney, Agent, or Firm*—Sawyer Law Group, P.C.

(57) ABSTRACT

This invention discloses a method for electroplating nickel/gold on electrically connecting pads on a substrate for chip package and structure thereof. The method comprises: forming a conductive film on a substrate circuit-patterned and defined with a circuit layer; forming on the substrate a resist with an opening for exposing a portion of the conductive film in an electrically connecting pad area intended for the circuit layer; removing a portion of the conductive film not covered with the resist; forming another resist on the substrate to cover a portion of the conductive film residually exposing from the resist; electroplating nickel/gold on at least one electrically connecting pad on the substrate such that the electrically connecting pad is electroplated with a nickel/gold layer; removing the resists and the conductive film thereunder; and forming a solder mask on the substrate, wherein the electrically connecting pad electroplated with the nickel/gold layer is exposed from the solder mask. The structure comprises a substrate circuit-patterned and defined with a circuit layer, wherein the circuit layer is provided with at least one electrically connecting pad exposed from a resist, the exposed surface of the electrically connecting pad is electroplated with a nickel/gold layer, and the substrate is spared with an electroplating wire for electroplating nickel/gold on the electrically connecting pad.

10 Claims, 7 Drawing Sheets

METHOD FOR FABRICATING A METAL PROTECTION LAYER ON ELECTRICALLY CONNECTING PAD OF CIRCUIT BOARD

CROSS REFERENCE TO RELATED APPLICATIONS

Under 35 U.S.C. 119(e), this application claims priority to Taiwanese Patent Application No. 95109420, filed Mar. 20, 2006, all of which is incorporated herein by reference.

FIELD OF THE INVENTION

This invention relates to methods for fabricating circuit boards having electrically connecting pads and, more particularly, to a method for fabricating a metal protecting layer on the electrically connecting pads formed on a circuit board.

BACKGROUND OF THE INVENTION

With the rapid development of electronic technology, modern electronic products are designed to have a compact size. Accordingly, semiconductor package manufacturers encounter many manufacturing bottlenecks. A plurality of conductive circuits made of copper and a plurality of electrically connecting pads extended from the conductive circuits, for electronic signal or power transmission, are formed on a surface of a circuit board applied in a semiconductor package fabrication process. A nickel/gold layer is further formed on the surfaces of the connecting pads for electrically coupling to other conductive components, such as gold wires or solder balls, and for preventing the connecting pads from oxidation. The connecting pads may be, for example, bonding fingers formed on a circuit board of a semiconductor chip package. Furthermore, the exposed surfaces of the connecting pads is covered by a nickel/gold layer, so that both the gold wires and the bonding fingers are made of the same material. This thereby allows the gold wires to be electrically coupled to the bonding fingers of the circuit board during a succeeding wire bonding process. The connecting pads are, for example, bump pads, ball pads or contact lands formed on the circuit board of the semiconductor package. Through the formation of the nickel/gold layer on the exposed surfaces of the connecting pads, the connecting pads usually made of copper, such as the bump pads, ball pads, and contact lands, covered with the nickel/gold layer are not likely to be oxidized, so that the electrical connection quality of the bump pads or ball pads is improved.

In order to follow the trend toward compact size for electronic products, a circuit board made by a non plating line (NPL) process is introduced to the market. In the NPL process, a nickel/gold layer is electroplated on the exposed surfaces of the connecting pads. FIGS. 1A to 1F, show the method disclosed in U.S. Pat. No. 6,576,540.

As shown in FIG. 1A, a circuit board 100 with a circuit layer 105 is provided by a completed circuit fabrication process.

As shown in FIG. 1B, a conductive film 110 is formed on the circuit board 100.

As shown in FIG. 1C, a first resistive layer 115 is formed on the conductive film 110. The first resistive layer 115 comprises an opening 1151 through which a portion of the conductive film 110 on the circuit layer 105 and the electrically connecting pads 1051 is exposed.

As shown in FIG. 1D, a portion of the conductive film 110 not covered by the first resistive layer 115 is removed.

As shown in FIG. 1E, a second resistive layer 120 is further formed on the circuit board 100, for covering a portion of the conductive film 110 remaining in the opening 1151 of the first resistive layer 115.

As shown in FIG. 1F, a nickel/gold layer 125 is electroplated on at least one of the electrically connecting pads 1051 of the circuit board 100.

In the fabrication process, a conductive film has to be disposed on both the top and bottom surfaces of the circuit board, and a plurality of patterned resistive layers are further provided in order to perform a photoresist image transfer process on the top and bottom surfaces of the circuit board twice. Hence, the fabrication process is complicated and characterized by a prolonged process cycle. As regards a fabrication process applied to the fabrication of a circuit board have a plurality of electrically connecting pads of fine pitch, for example, a substrate for IC packaging with a ball pad diameter that ranges between 350 and 450 μm, and a ball pitch (the distance between the centers of two neighboring ball pads) less than 500 μm, the distance between the edges of two neighboring ball pads is around 100 μm—a distance much shorter than the ball pad diameter (350~450 μm). Given the aforesaid dimensions, performing a photoresist image transfer process twice entails covering a conductive film residually exposed out of an opening in the first resist layer with the second resist layer, and thus an opening of the second resist layer has to be smaller than that of the first resist layer. However, owing to the limits in the precision of alignment of a photolithography process, a small through hole is liable to alignment errors, and in consequence the second resist layer fails to cover the first resist layer precisely; as a result, no nickel/gold layers can be precisely electroplated on the ball pads by a subsequent electroplating process.

Therefore, providing a cheap and simple method for fabricating a circuit board structure by electroplating a metal layer such as a nickel/gold layer on electrically connecting pads to solve the problems arising from the adoption of the NPL process in the circuit board fabrication process of the prior art is becoming one of the most urgent issues in the art.

SUMMARY OF THE INVENTION

In view of the above-mentioned problems of the prior art, it is the primary objective of the present invention to provide a method for fabricating a metal protecting layer on electrically connecting pads formed on a circuit board, so as to simplify the fabrication process and shorten the cycle time.

Another objective of the present invention is to provide a method for fabricating a metal protecting layer on an electrically connecting pad of a circuit board, for forming the metal protecting layer on the electrically connecting pad of fine pitch effectively.

A further objective of the present invention is to provide a method for fabricating a metal protecting layer on an electrically connecting pad of a circuit board, to meet the requirement of fine ball pitch.

To achieve the above-mentioned and other objectives, a method for fabricating a metal protecting layer on an electrically connecting pad of a circuit board is provided according to the present invention. The method includes providing a circuit board having a chip-disposed side and a ball-disposed side, forming in the circuit board at least one through hole penetrating the circuit board from the chip-disposed side to the ball-disposed side; forming a metal layer on the chip-disposed side, the ball-disposed side and a surface defining the through hole of the circuit board, forming at least one conductive structure on the surface in the through hole; forming a first and a second circuit layers on the metal layer on the chip-disposed side and the ball-disposed side of the circuit board respectively, by a circuit patterning process, the first and the second circuit layers each having a plurality of electrically connecting pads and being electrically connected to each other by the conductive structure; forming on the first circuit layer a conductive layer electrically connected to the electrically connecting pads of the first and second circuit layers; and electroplating the metal protecting layer on the electrically connecting pads of the first and the second circuit layers through the conductive layer.

The electrically connecting pads of the first circuit layer comprise at least one independent electrically connecting pad and at least one dependent electrically connecting pad not electrically connected to the independent electrically connecting pad but to the conductive structure. Each of the electrically connecting pads of the second circuit layer is electrically connected to the at least one conductive structure formed in each through hole. The dependent electrically connecting pad of the first circuit layer is electrically connected to the electrically connecting pad of the second circuit layer via the conductive structure. The electrically connecting pad of the second circuit layer is, for example, a ball pad or a contact land.

The method of the present invention further includes forming a first and a second resistive layer on the second circuit layer and the conductive layer of the first circuit layer s, forming a plurality of openings on the first and the second resistive layers for exposure of the conductive layer formed on the electrically connecting pad formed on the first circuit layer and the electrically connecting pad formed on the second circuit layer, removing the conductive layer in the openings of the first resistive layer, forming a third resistive layer having a plurality openings corresponding in position to the electrically connecting pads, so as to cover the conductive layer remained in the openings of the first resistive layer, forming a metal protecting layer on the electrically connecting pads, and removing the first, the second and the third resistive layer, so as to expose the first and the second circuit layers and the metal protecting layer formed on the electrically connecting pads.

Moreover, the circuit board fabrication process further includes forming on the first and the second circuit layers and the chip-disposed and the ball-disposed sides of the circuit board an insulated protection layer having an opening for exposure of the metal protecting layer formed on the electrically connecting pads.

In summary, the method for fabricating a metal protecting layer on at least one electrically connecting pad of a circuit board according to the present invention includes forming a first and a second circuit layers on a chip-disposed side and a ball-disposed side of a circuit board respectively, forming at least one conductive layer in the circuit board for electrically connecting the electrically connecting pads of the first and second circuit layers, forming at least one conductive layer on the first circuit layer, allowing the conductive layer to electrically connect the electrically connecting pads of the first and the second circuit layers, performing a photoresist image transfer process on the first circuit layer and/or the first and/or third resistive layers twice, performing the photoresist image transfer process on the second circuit layer and/or second resistive layer once, for exposing the electrically connecting pads of the first and the second circuit layers. Therefore, during a succeeding electroplating process, the metal protecting layer can be formed on the electrically connecting pads of the first and the second circuit layers through the conductive layer functioning as an electricity path.

Compared with the prior art, the present invention omits the steps of disposing a conductive film on both the top and bottom surfaces of a circuit board during a NPL process. Instead, the present invention uses a conductive layer formed on a first circuit layer and electrically connected to a second circuit layer to electroplate a metal protecting layer on electrically connecting pads of the first and the second circuit layers, the electrically connecting pad of the second circuit layer being, for example, a contact land or a ball pad. Therefore, the present invention simplifies the fabrication process, reduces the fabrication cost, and forms the metal protecting layer on the electrically connecting pads of fine pitch effectively. Moreover, the present invention involves performing a photoresist image transfer process on the ball-disposed side of the circuit board once only, so that in an exposure process to expose the electrically connecting pads of the second circuit layer, the position requirement is reduced. Therefore, the present invention reduces the time spent on the exposure process and the cycle time for fabricating a circuit board, and meets the requirement of fine ball pitch.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The following illustrative embodiments are provided to illustrate the disclosure of the present invention, these and other advantages and effects can be apparently understood by those skilled in the art after reading the disclosure of this specification. The present invention can also be performed or applied by other different embodiments. The details of the specification may be modified and varied on the basis of different points and applications, and numerous modifications and variations can be devised without departing from the spirit of the present invention.

FIGS. 2A to 2J are ten cross-sectional views demonstrating a method for fabricating a metal protecting layer on electrically connecting pads of a circuit board according to the present invention. Note that these drawings are simplified schematic diagrams, and the fabrication process of a circuit board of the present invention is described schematically.

Figure 1A:
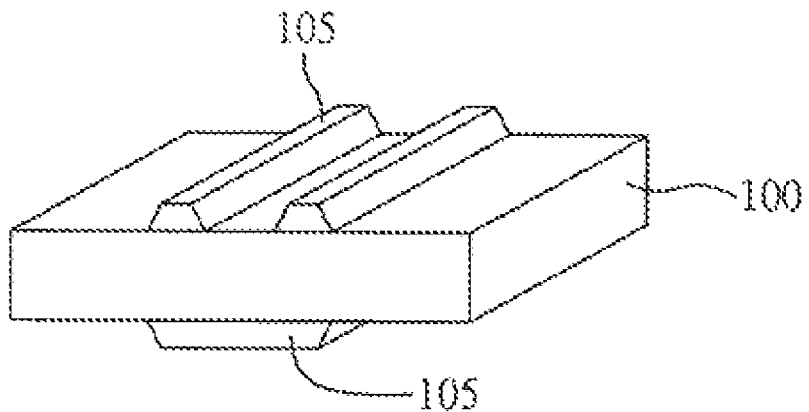
FIGS. 1A to 1F are six cross-sectional views demonstrating a nickel/gold fabrication process disclosed in U.S. Pat. No. 6,576,540.
Figure 1B:
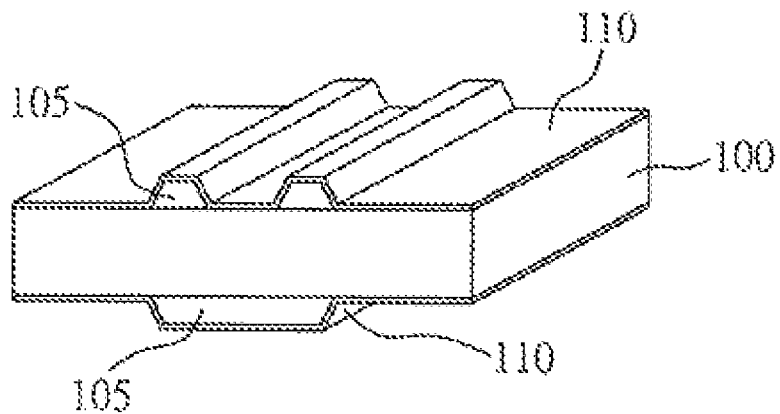
Figure 1C:
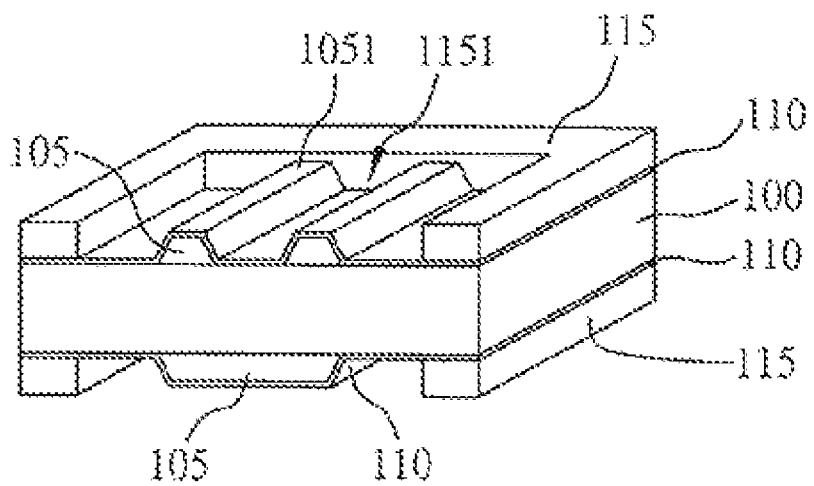
Figure 1D:
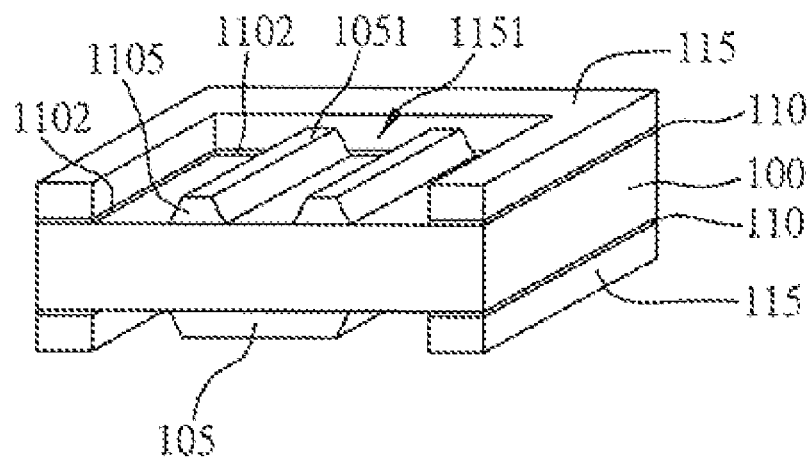
Figure 1E:
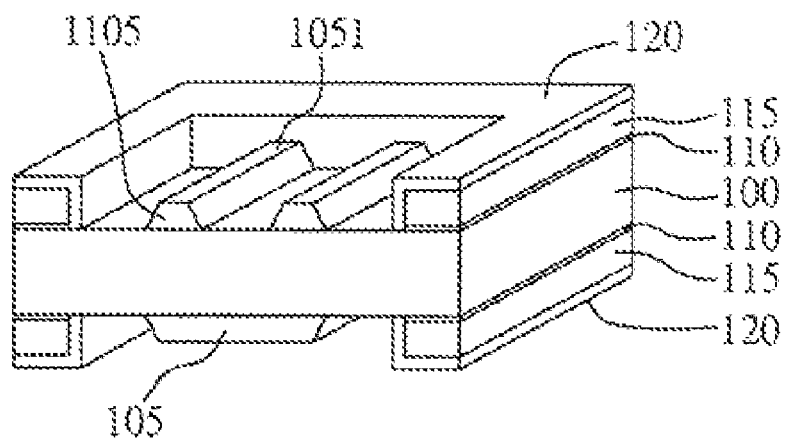
Figure 1F:
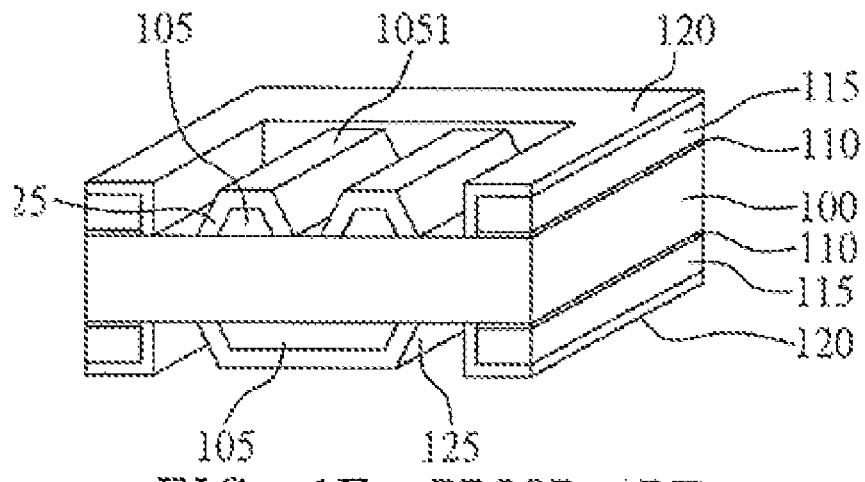
Figure 2A:
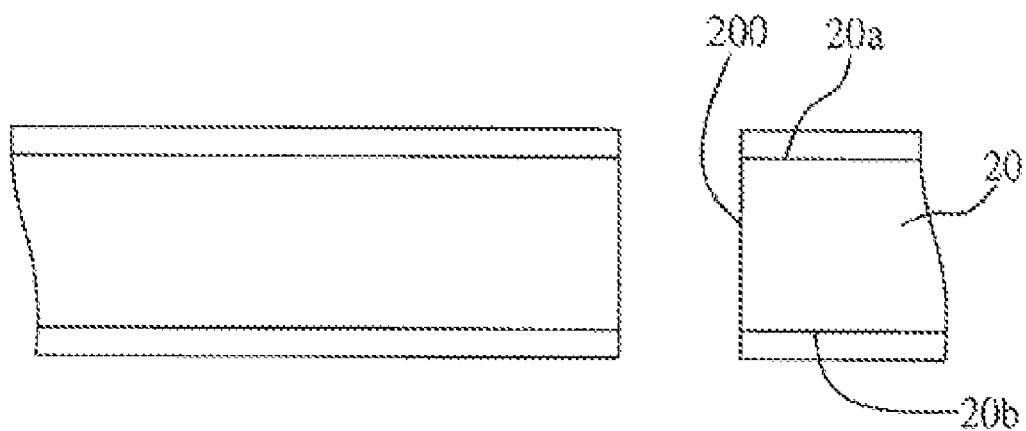
FIGS. 2A to 2J are ten cross-sectional views demonstrating a method for fabricating a metal protecting layer on an electrically connecting pad of a circuit board according to the present invention.

As shown in FIG. 2A, a circuit board 20 is provided. The circuit board 20 comprises a chip-disposed side 20a and a ball-disposed side 20b opposed to the chip-disposed side 20a. Further, at least one through hole 200 penetrating the circuit board 20 from the chip-disposed side 20a to the ball-disposed side 20b is formed in the circuit board 20. The circuit board 20 is a double-sided copper-clad laminate/substrate or a double-sided resin-coated copper-clad (RCC) core board. The core board is a double-layered or multi-layered circuit board having at least one inner circuit connection. The embodiment is exemplified by the double-sided copper-clad substrate. The present invention relates to a method for fabricating electrically connecting pads on a circuit board, but the inner circuit connection of the circuit board is a prior art and thus further description is hereby omitted.

Figure 2B:
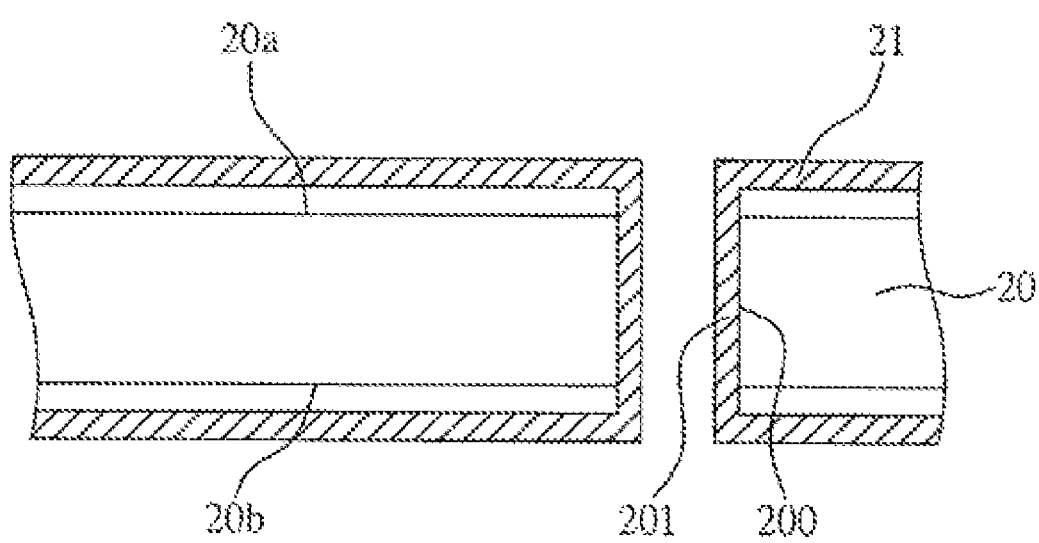

As shown in FIG. 2B, at least one conductive layer (not shown) is first formed on the chip-disposed side 20a, the ball-disposed side 20b and the through hole 200 of the circuit board 20. Through the conductive layer, a metal layer 21 is formed, and at least one conductive structure 201 such as a plated through hole (PTH) is formed in the through hole 200.

Figure 2C:
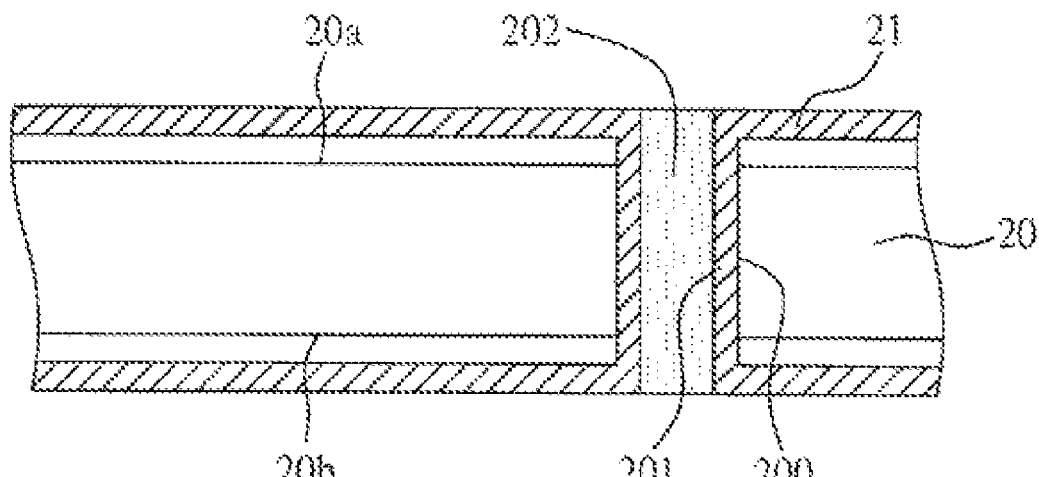

As shown in FIG. 2C, an opening filling material 202, such as resin, fills the through hole 200. According to the embodiment, the metal layer 21 is a copper layer, which can be formed on the chip-disposed side 20a, ball-disposed side 20b and through hole 200 of the circuit board 20 by, for example, an electroplating process.

Figure 2D:
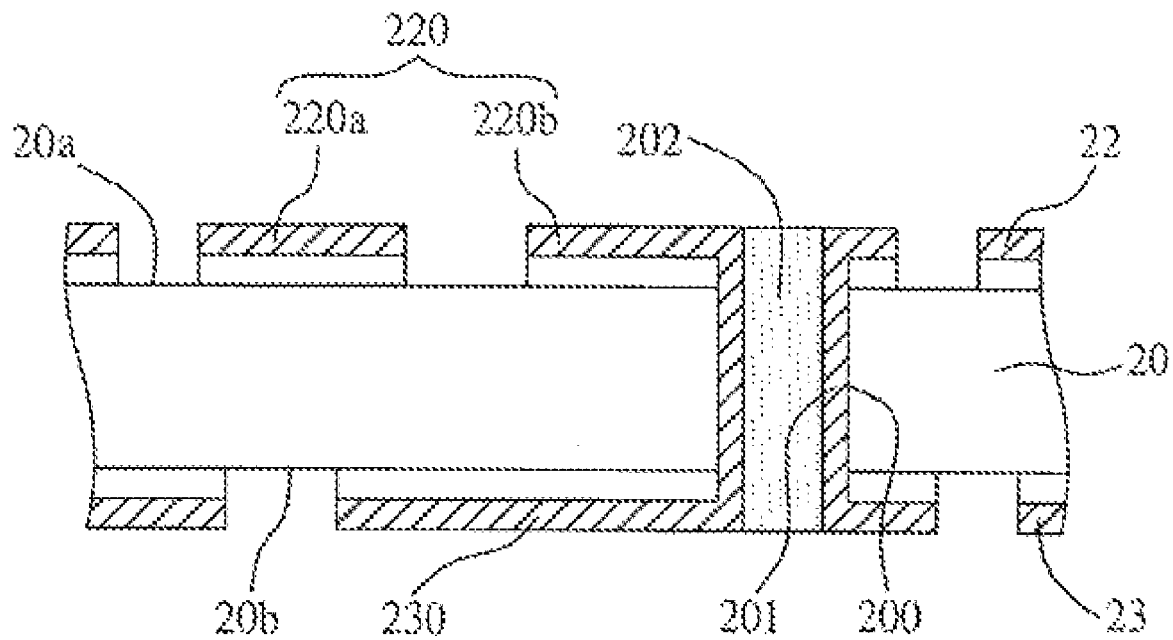

As shown in FIG. 2D, a circuit patterning process is performed on the metal layer 21, to form a first circuit layer 22 and a second circuit layer 23 on the chip-disposed side 20a and the ball-disposed side 20b of the circuit board 20 respectively. The first and the second circuit layers 22 and 23 comprise electrically connecting pads 220 and 230 respectively. The electrically connecting pads 220 and 230 of the first and the second circuit layers 22 and 23 are electrically connected by the conductive structure 201. In the embodiment, the electrically connecting pad 220 of the first circuit layer 22 comprises at least one independent electrically connecting pad 220a and at least one dependent electrically connecting pad 220b. At least one independent electrically connecting pad 220a is not electrically connected to the conductive structure 201, but at least one dependent electrically connecting pad 220b is electrically connected to the conductive structure 201. The electrically connecting pad 230 of the second circuit layer 23 is, for example, a ball pad or a contact land. In the embodiment, the dependent electrically connecting pad 220b of the first circuit layer 22 is electrically connected via the conductive structure 201 to the electrically connecting pad 230 of the second circuit layer 23.

Figure 2E:
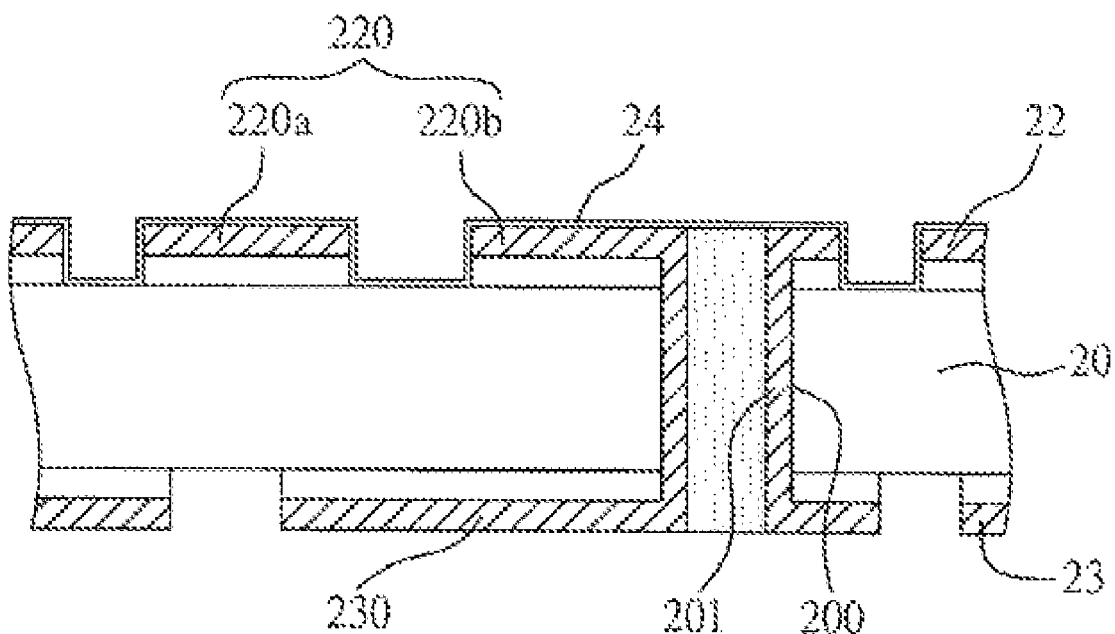

As shown in FIG. 2E, a conductive layer 24 is formed on the first circuit layer 22. The conductive layer 24 is electrically connected to the electrically connecting pads 220 and 230 of the first and the second circuit layers 22 and 23. The conductive layer 24 functions as an electricity path required for an electroplated metal material. The conductive layer 24 is composed of metal, alloy or a plurality of deposited metal layers. The conductive layer 24 is one selected from the group consisting of copper, tin, nickel, chromium, titanium, copper/chromium, and tin/lead, or can be made of a conductive polymer, such as polyacetylene, polyaniline and organosulfur polymer.

Figure 2F:
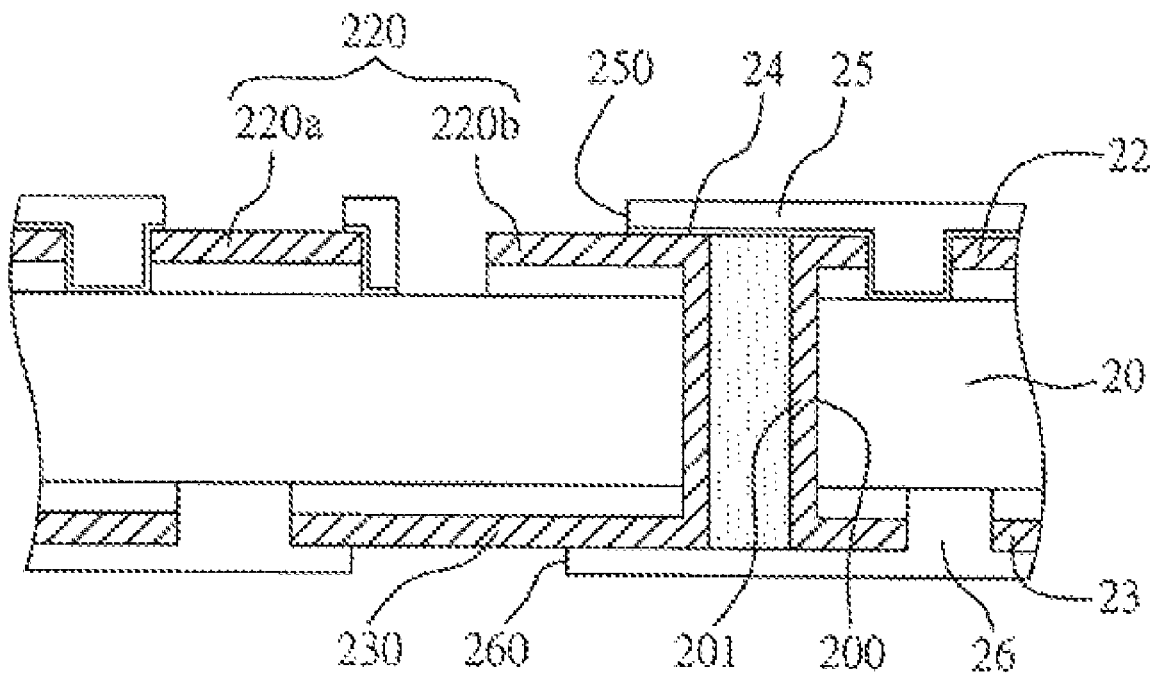

As shown in FIG. 2F, a first resistive layer 25 and a second resistive layer 26 are formed on the conductive layer 24 and the second circuit layer 23 respectively. Two openings 250 and 260 corresponding in position to the electrically connecting pads 220 and 230 are formed in the first resistive layer 25 and the second resistive layer 26 respectively by a photoresist image transfer process. The conductive layer 24 formed on the first circuit layer 22 in the opening 250 of the first resistive layer 25 is then removed, for exposing the electrically connecting pad 220.

Figure 2G:
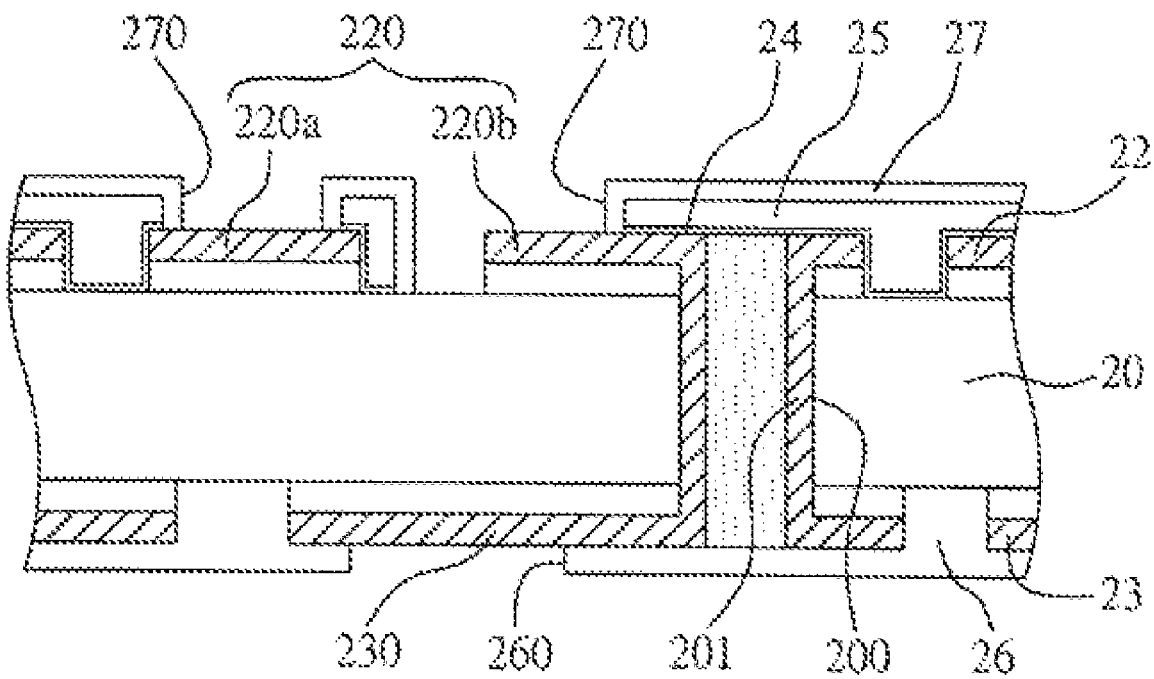

As shown in FIG. 2G, a third resistive layer 27 is formed on the first resistive layer 25 on the first circuit layer 22. At least an opening 270 corresponding in position to the electrically connecting pad 220 of the first circuit layer 22 is formed in the third resistive layer 27 by the photoresist image transfer process. The third resistive layer 27 covers the conductive layer 24 remained in the opening 250 of the first resistive layer 25.

Figure 2H:
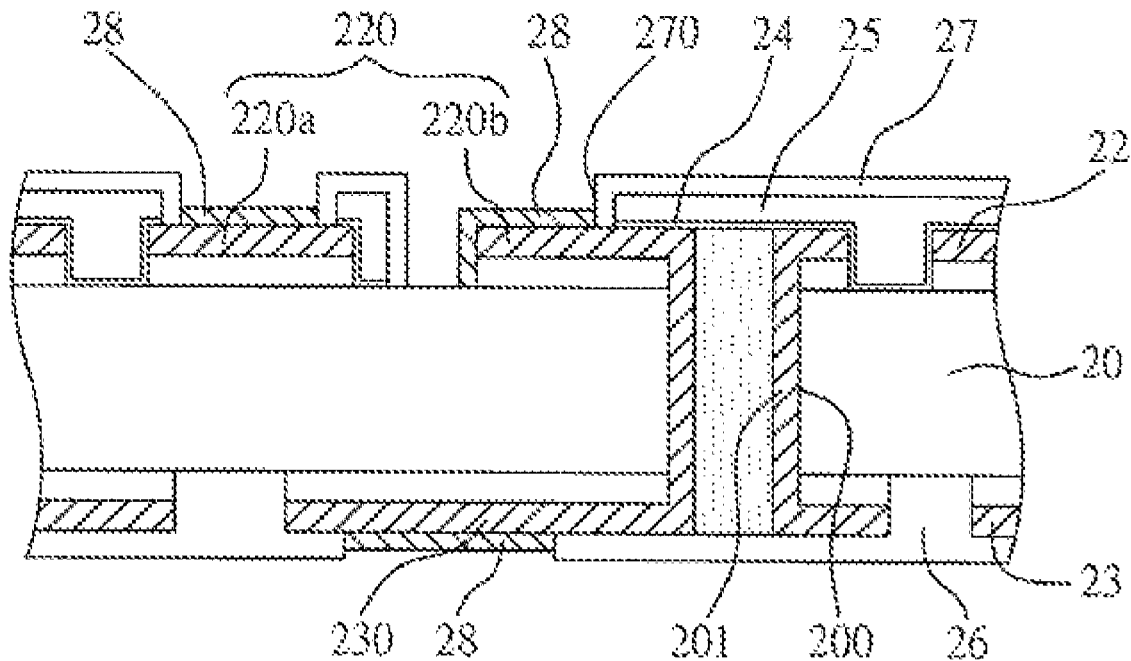

As shown in FIG. 2H, through the conductive layer 24, a metal protecting layer 28 is formed on the electrically connecting pads 220 and 230 of the first circuit layer 22 and the second circuit layer 23. The metal protecting layer 28 is, for example, a nickel/gold layer. In the embodiment, the conductive structure 201 electrically connects the dependent electrically connecting pad 220b of the first circuit layer 22 and the electrically connecting pad 230 of the second circuit layer 23, and thus the conductive layer 24, which is formed on the first circuit layer 22, is electrically connected to the electrically connecting pads 220 and 230. Therefore, the conductive layer 24 can serve as the electricity path in the succeeding electroplating process, and the metal protecting layer 28 can be electroplated on the electrically connecting pads 220 and 230.

Figure 2I:
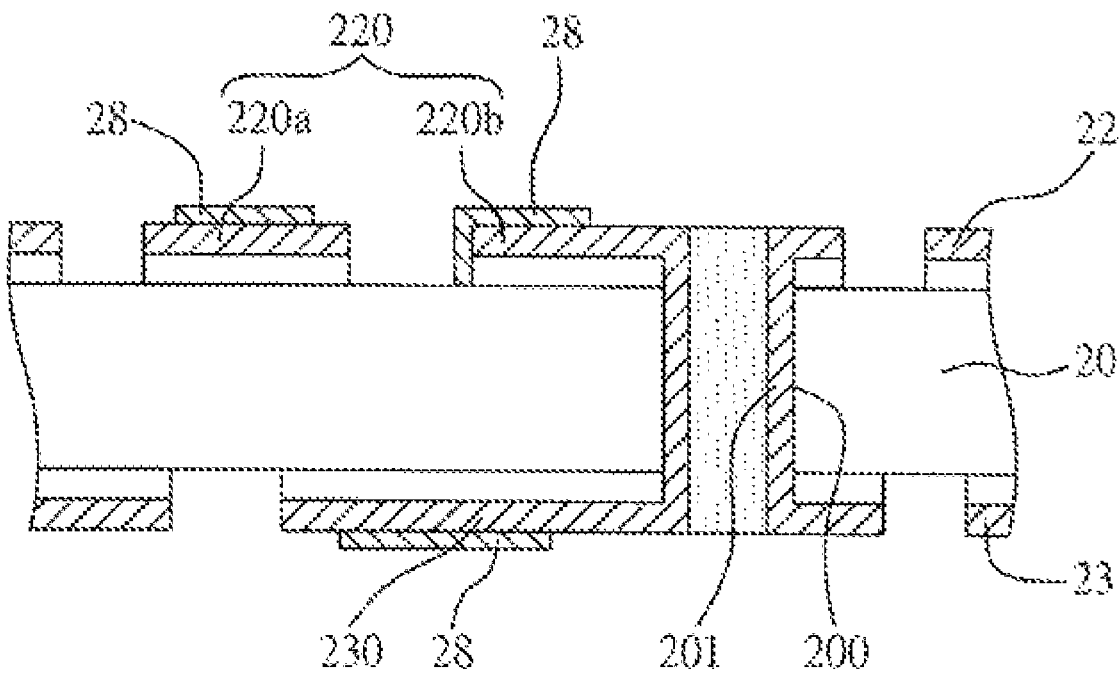

As shown in FIG. 2I, the first resistive layer 25, second resistive layer 26, third resistive layer 27 and the conductive layer 24 covered by the first resistive layer 25 are all removed. The removal of the first resistive layer 25, second resistive layer 26, third resistive layer 27 and conductive layer 24 can be accomplished by a variety of means which are known by the manufacturers nowadays, thus further description is herein omitted.

Figure 2J:
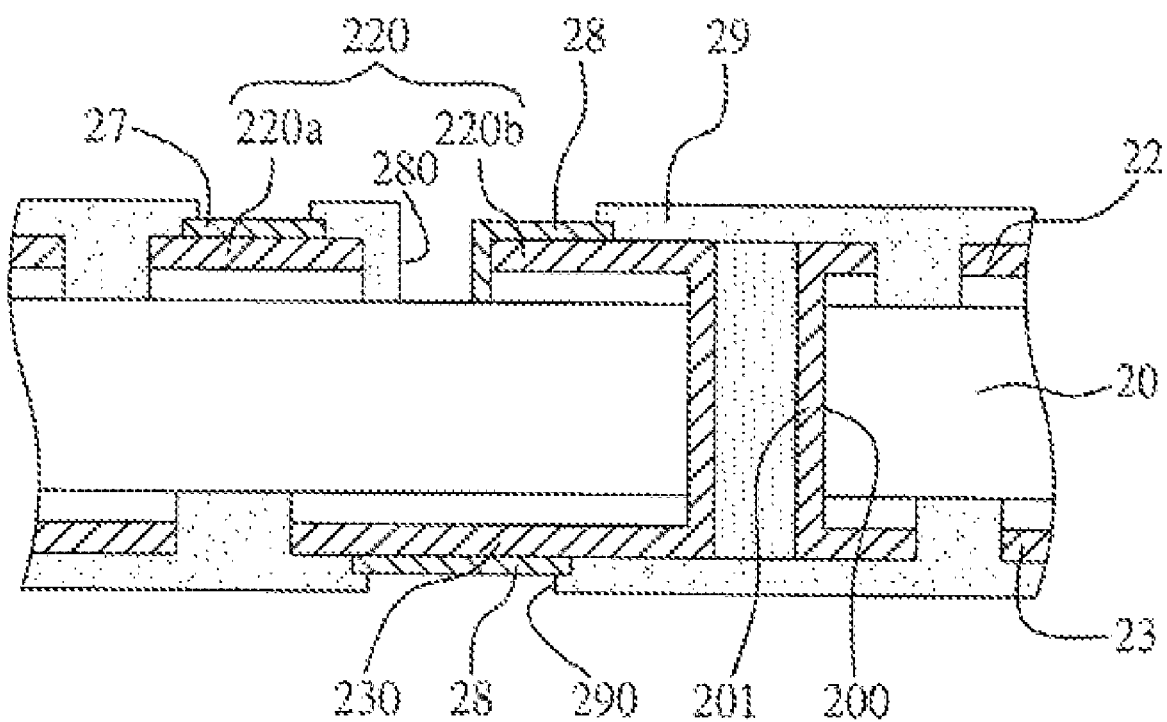

As shown in FIG. 2J, two insulated protection layers 29 are formed on the first and the second circuit layers 22 and 23 respectively. Two openings 290 are formed in the insulated protection layers 29 and corresponding in position to the electrically connecting pads 220 and 230, for exposing the metal protecting layer 28 formed on the electrically connecting pads 220 and 230.

A semiconductor component is further installed on the circuit board manufacturing by the method of the present invention, so as to complete an external electrical connection of the circuit board.

In summary, the method for fabricating a metal protecting layer on at least one electrically connecting pad of a circuit board according to the present invention includes forming a first and a second circuit layers on a chip-disposed side and a ball-disposed side of a circuit board respectively, forming at least one conductive layer in the circuit board for electrically connecting the electrically connecting pads of the first and the second circuit layers, forming at least one conductive layer on the first circuit layer, allowing the conductive layer to electrically connect the electrically connecting pads of the first and the second circuit layers, performing a photoresist image transfer process on the first circuit layer and/or the first resistive layers and/or the third resistive layers twice, performing the photoresist image transfer process on the second circuit layer and/or second resistive layer once, for exposing the electrically connecting pads of the first and the second circuit layers. Therefore, with the conductive layer acting as an electricity path, during a succeeding electroplating process, the metal protecting layer can be formed on the electrically connecting pads of the first and the second circuit layers.

Compared with the prior art, the present invention omits the step of disposing a conductive film on both the top and bottom surfaces of the circuit board during the NPL process. By contrast, as disclosed in the present invention, the metal protecting layer is electroplated on the electrically connecting pads of the first and second circuit layers, through the conductive layer formed on the first circuit layer and electrically connected to the second circuit layer by the conductive structure, wherein the electrically connecting pad of the second circuit layer is, for example, a contact land or a ball pad. Therefore, the present invention simplifies the fabrication process, reduces the fabrication cost, and forms the metal protecting layer on the electrically connecting pads of fine pitch effectively. Moreover, the present invention involves performing the photoresist image transfer process on the ball-disposed side of the circuit board once only, so that in an exposure process for exposing the electrically connecting pad of the second circuit layer, the position requirement is reduced. Therefore, the present invention reduces the time spent on the exposure process and the cycle time for fabricating a circuit board, and meets the requirement of fine ball pitch.

The foregoing descriptions of the detailed embodiments are only illustrated to disclose the features and functions of the present invention and not restrictive of the scope of the present invention. It should be apparent to those skilled in the art that all modifications and variations made according to the spirit and principle in the disclosure of the present invention should fall within the scope of the appended claims.

What is claimed is:

1. A method for fabricating a metal protecting layer on an electrically connecting pad of a circuit board, the method comprising the steps of:

providing a circuit board having a chip-disposed side and a ball-disposed side;

forming in the circuit board at least one through hole penetrating the circuit board from the chip-disposed side to the ball-disposed side;

forming a metal layer on the chip-disposed side, the ball-disposed side, and a surface defining the through hole of the circuit board;

forming at least one conductive structure on the surface defining the through hole;

forming a first and a second circuit layers on the metal layer on the chip-disposed side and the ball-disposed side of the circuit board, respectively, by a circuit patterning process, wherein the first and the second circuit layers each having a plurality of electrically connecting pads are electrically connected to each other by the conductive structure;

forming on the first circuit layer a conductive layer electrically connected to the electrically connecting pads of the first and the second circuit layers;

forming a first and a second resistive layers on the conductive layer and the second circuit layer respectively;

forming a plurality of openings in the first and the second resistive layers respectively for exposure of the electrically connecting pads of the first and the second circuit layers;

removing the conductive layer in the openings of the first resistive layer on the first circuit layer;

forming a third resistive layer on the first resistive layer on the first circuit layer;

forming in the third resistive layer a plurality of openings corresponding in position to the electrically connecting pads of the first circuit layer, so as to cover the conductive layer remained in the openings of the first resistive layer with the third resistive layer;

electroplating the metal protecting layer on the electrically connecting pads of the first and the second circuit layers through the conductive layer;

removing the first, the second and the third resistive layers, for exposing the first and the second circuit layers and the metal protecting layer formed on the electrically connecting pads;

forming an insulated protection layer on the first and the second circuit layers and the chip-disposed and the ball-disposed sides of the circuit board; and forming a plurality of openings in the insulated protection layer, for exposing the metal protecting layer formed on the electrically connecting pads.

2. The method of claim 1, wherein the circuit board is one selected from the group consisting of a double-sided copper-clad laminate/substrate and a double-sided resin-coated copper-clad core board.

3. The method of claim 2, wherein the core board is one selected from the group consisting of a double-layered circuit board and a multi-layered circuit board, both of which have inner circuit interconnections.

4. The method of claim 1, wherein the conductive structure is a plated through hole (PTH).

5. The method of claim 1, wherein the electrically connecting pads of the first circuit layer comprises at least one independent electrically connecting pad and at least one dependent electrically connecting pad.

6. The method of claim 5, wherein the at least one independent electrically connecting pad is not electrically connected to the conductive structure.

7. The method of claim 5, wherein the at least one dependent electrically connecting pad is electrically connected to the conductive structure.

8. The method of claim 5, wherein the electrically connecting pads of the second circuit layer comprise at least one dependent electrically connecting pad.

9. The method of claim 8, wherein the at least one dependent electrically connecting pad is electrically connected to the conductive structure.

10. The method of claim 1, wherein the electrically connecting pads of the second circuit layer are one selected from the group consisting of a ball pad and a contact land.

* * * * *